(12) United States Patent
Gailus et al.

(10) Patent No.: US 6,181,219 B1
(45) Date of Patent: Jan. 30, 2001

(54) PRINTED CIRCUIT BOARD AND METHOD FOR FABRICATING SUCH BOARD

(75) Inventors: Mark W. Gailus, Somerville; Philip T. Stokoe, Attleboro, both of MA (US); Thomas S. Cohen, New Boston, NH (US)

(73) Assignee: Teradyne, Inc., Boston, MA (US)

( * ) Notice: Under 35 U.S.C. 154(b), the term of this patent shall be extended for 0 days.

(21) Appl. No.: 09/204,118

(22) Filed: Dec. 2, 1998

(51) Int. Cl.$^7$ .................................. H01P 3/08; H05K 1/18
(52) U.S. Cl. ............................. 333/33; 333/246; 174/262
(58) Field of Search ............................. 333/33, 246, 247, 333/260; 174/262, 263, 266; 439/63, 608

(56) References Cited

U.S. PATENT DOCUMENTS

| | | |
|---|---|---|
| 3,193,789 | 7/1965 | Brown et al. . |
| 3,243,498 | 3/1966 | Allen et al. . |
| 3,568,000 | 3/1971 | D'Aboville ........................ 361/794 |

(List continued on next page.)

FOREIGN PATENT DOCUMENTS

| | | |
|---|---|---|
| 0 165 575 A2 | 12/1985 | (EP) . |
| 968-82 | 5/1980 | (JP) . |
| 58-106968 | 7/1983 | (JP) . |
| 60-10648 | 1/1985 | (JP) . |
| 60-42896 | 3/1985 | (JP) . |
| 62-73697 | 4/1987 | (JP) . |
| 62-235795 | 10/1987 | (JP) . |
| 02094693 | 4/1990 | (JP) . |
| 06021253 | 1/1994 | (JP) . |
| 06338687 | 12/1994 | (JP) . |
| 09321433 | 12/1997 | (JP) . |
| 85/05529 | 12/1985 | (WO) . |

OTHER PUBLICATIONS

H.W. Markstein: "Ensuring Signal Integrity in Connectors, Cables and Backplanes," Electronic Packaging and Production., vol. 36, No. 11, Oct. 1996 (Oct. 1996), pp. 61–69, XP000633445.

"Matched Impedance Plane–to–Plane Connection," IBM Technical Disclosure Bulletin., vol. 32, No. 11, Apr. 1990 (Apr. 1990), pp. 336–337, XP000097730.

*Primary Examiner*—Benny Lee
*Assistant Examiner*—Stephen E. Jones

(57) ABSTRACT

A printed circuit board assembly having a pair of printed circuit boards. Each one of the boards has a conductive via passing from a surface of a dielectric into an interior region of the dielectric. Each one of the printed circuit boards has a reference potential layer and a signal conductor disposed in the dielectric thereof parallel to, the reference potential layer thereof to provide a transmission line having a predetermined impedance. The signal conductor of each one of the boards is connected to the conductive via thereof. The conductive via in each one of the boards is configured to provide an impedance to the transmission line thereof substantially matched to the impedance of the transmission line thereof. A first electrical connector is provided having a signal contact connected to the conductive via of one of the boards and a second electrical connector having a signal contact connected to the conductive via of the other one of the boards. The first signal contact of the first electrical conductor is adapted for electrical connection to the second contact of the second electrical connector.

18 Claims, 5 Drawing Sheets

U.S. PATENT DOCUMENTS

| | | | | |
|---|---|---|---|---|
| 4,494,083 | * | 1/1985 | Josefsson et al. | 333/33 |
| 4,598,470 | | 7/1986 | Dougherty, Jr. et al. | 29/837 |
| 4,668,332 | | 5/1987 | Ohnuki et al. | 216/19 |
| 4,787,853 | | 11/1988 | Igarashi | 439/55 |
| 4,859,806 | | 8/1989 | Smith . | |
| 4,906,198 | | 3/1990 | Cosimano et al. | 439/82 |
| 4,949,163 | * | 8/1990 | Sudo et al. | 333/247 X |
| 5,038,252 | | 8/1991 | Johnson | 361/414 |
| 5,266,912 | * | 11/1993 | Kledzik | 333/33 X |
| 5,399,104 | * | 3/1995 | Middlehurst et al. | 439/608 |
| 5,487,218 | | 1/1996 | Bhatt et al. | 29/852 |
| 5,568,107 | | 10/1996 | Buuck et al. | 333/238 |
| 5,689,216 | * | 11/1997 | Sturdivant | 333/33 |
| 5,718,606 | * | 2/1998 | Rigby et al. | 439/608 |
| 5,961,349 | * | 10/1999 | Paagman | 439/63 X |

\* cited by examiner

PRINTED CIRCUIT BOARD AND METHOD FOR FABRICATING SUCH BOARD

BACKGROUND OF THE INVENTION

This invention relates generally to printed circuit boards and manufacturing methods and particularly to printed circuit boards adapted to carry signals having very high data rates.

As is known in the art, printed circuit boards are used to couple data among electrical components mounted on a surface of such board. This data is coupled through signal conductors disposed at various levels in the board. The board also carries reference potentials, such as ground and component supply voltages. In order to provide isolation between signal conductors in the various levels, reference potential conductive planes are interspersed between the levels of signal conductors.

As is also known in the art, in order to connect to the components, conductive vias are provided which pass from the surface of the board to the interior region thereof for connection to the signal conductors. These vias form what are sometimes called "signal launches." Further, in many cases it is necessary to electrically connect components on one printed circuit board to components on another printed circuit board. This is typically done with an electric connector assembly. The connector assembly has two parts, each part mounted to a corresponding one of the printed circuit boards. Thus, when it is desired to connect one board to the other board, the connector parts are plugged into one another.

Further, as is known in the art, the data rates of the signals propagating through printed circuit boards are ever increasing. As such data rates increase, it is necessary to improve the efficiency of the electrical coupling of the data passing through one of the printed circuit boards to the other printed circuit board. More particularly, the signal conductor, reference potential plane or layer, and portions of the dielectric of the board therebetween form a transmission line having a predetermined impedance, typically 50 ohms. The effect of the via provides an impedance mismatch to the impedance of the transmission line. One technique used to compensate for this impedance mismatch is to provide compensation elements in the connector. For vias with impedance below the impedance of signal traces in the boards, some connectors are designed to have a higher impedance so that on average the impedance is the same as the interconnect as it is in the board. However, signal reflections which can limit performance of an interconnect depend on changes in impedance.

SUMMARY OF THE INVENTION

In accordance with the invention, a printed circuit board is provided having a conductive via passing from a surface of a dielectric into an interior region of the dielectric. A reference potential layer is disposed in the interior region of the dielectric parallel to the surface. A signal conductor is disposed in the dielectric parallel to the reference potential layer to provide a transmission line having a predetermined impedance. The conductive via is configured to provide an impedance to the transmission line substantially matched to the impedance of the transmission line.

With such an arrangement, impedance matching is provided internal to the printed circuit board thereby enabling connection of such board to another board with reduced reflections caused by the impedance mismatch through the connector launch. We have recognized that matching the average impedance of an interconnect to the impedance of the board can limit performance of an interconnect, particularly for high frequency signals. We have recognized the benefits of vias with impedance that is more similar to the impedance of the printed circuit board.

In accordance with another feature of the invention, a printed circuit board is provided having a conductive via passing from a surface of a dielectric into an interior region of the dielectric. The conductive via has a wider region at a surface region of the dielectric than at an interior region of the dielectric. A reference potential layer is disposed in the interior region of the dielectric. A signal conductor is disposed in the dielectric parallel to the reference potential layer to provide a transmission line having a predetermined impedance. The signal conductor is connected to the conductive via. The conductive via is configured to provide an impedance to the transmission line substantially matched to the impedance of the transmission line. More particularly, the wider, surface portion of the hollow conductive via is selected to accommodate a terminal pin of the connector while the narrower, interior portion of the conductive via is selected for impedance matching.

In accordance with another feature of the invention, a printed circuit board is provided having a conductive via passing from a surface of a dielectric into an interior region of the dielectric. The conductive via has a wider region at a surface region of the dielectric than at an interior region of the dielectric. A plurality of different levels of reference potential layers is disposed in the interior region of the dielectric and parallel to the surface. The plurality of layers have edges terminating at different distances from the conductive via.

In accordance with another feature of the invention, a printed circuit board assembly is provided having a pair of printed circuit boards. Each one of the boards has a conductive via passing from a surface of a dielectric into an interior region of the dielectric. Each one of the printed circuit boards has a reference potential layer and a signal conductor disposed in the dielectric thereof parallel to the reference potential layer thereof to provide a transmission line having a predetermined impedance. The signal conductor of each one of the boards is connected to the conductive via thereof. The conductive via in each one of the boards is configured to provide an impedance to the transmission line thereof substantially matched to the impedance of the transmission line thereof. A first electrical connector is provided having a signal contact connected to the conductive via of one of the boards and a second electrical connector having a signal contact connected to the conductive via of the other one of the boards. The first signal contact of the first electrical conductor is adapted for electrical connection to the second contact of the second electrical connector.

In accordance with another feature of the invention, a pair of printed circuit boards are electrically interconnected through an electrical connector. Each one of the printed circuit boards has a conductive via passing from a surface of a dielectric into an interior region of the dielectric. A reference potential layer is disposed in the interior region of the dielectric parallel to the surface. A signal conductor is disposed in the dielectric parallel to the reference potential layer to provide a transmission line having a predetermined impedance. The conductive via is configured to provide an impedance to the transmission line substantially matched to the impedance of the transmission line. The impedance from one of the boards through the electrical connector to the other one of the boards is substantially constant.

In accordance with another feature of the invention, a method is provided for fabricating a printed circuit board.

The method includes determining an impedance of a transmission line in a printed circuit board, such transmission line having a signal conductor separated by a reference potential layer by a portion of a dielectric; and determining a configuration of a conductive via in the dielectric passing from a surface of the dielectric to an interior region of the dielectric, and connected to the signal conductor, to provide the transmission line with a termination impedance substantially matched to the impedance of the transmission line.

In accordance with another feature of the invention, a method for fabricating a printed circuit board is provided. The method includes determining an impedance of a transmission line in a printed circuit board, such transmission line having a signal conductor separated by a reference potential layer by a portion of a dielectric; and determining a configuration of a conductive via having a wider region at a surface region of the dielectric than at an interior region of the dielectric, and connected to the signal conductor, to provide the transmission line with a termination impedance substantially matched to the impedance of the transmission line.

In accordance with another feature of the invention, a method for fabricating a printed circuit board is provided. The method includes determining an impedance of a transmission line in the printed circuit board, such transmission line having a signal conductor separated by a reference potential layer by a portion of a dielectric; and determining a distance between a conductive via in the dielectric passing from a surface of the dielectric to an interior region of the dielectric, and connected to the signal conductor, and an edge of the reference potential layer to provide the transmission line with a termination impedance substantially matched to the impedance of the transmission line.

BRIEF DESCRIPTION OF THE DRAWING

These and other features of the invention, as well as the invention itself, will become more readily apparent from the following detailed description when taken together with the following drawings, in which.

DESCRIPTION OF THE PREFERRED EMBODIMENTS

Figure 1:
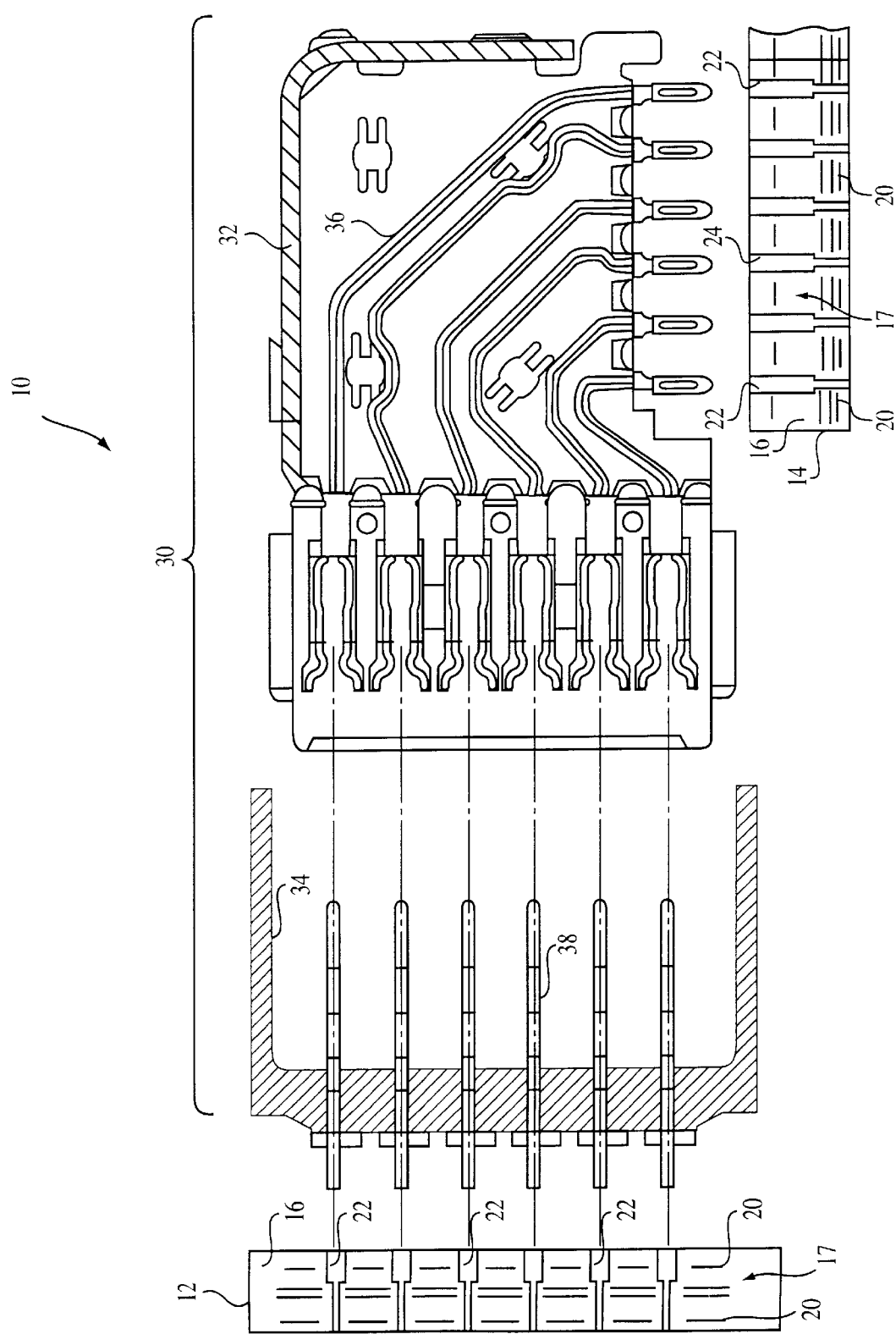
FIG. 1 is an exploded, cross-sectional sketch of a printed circuit board assembly according to the invention.
Figure 2:
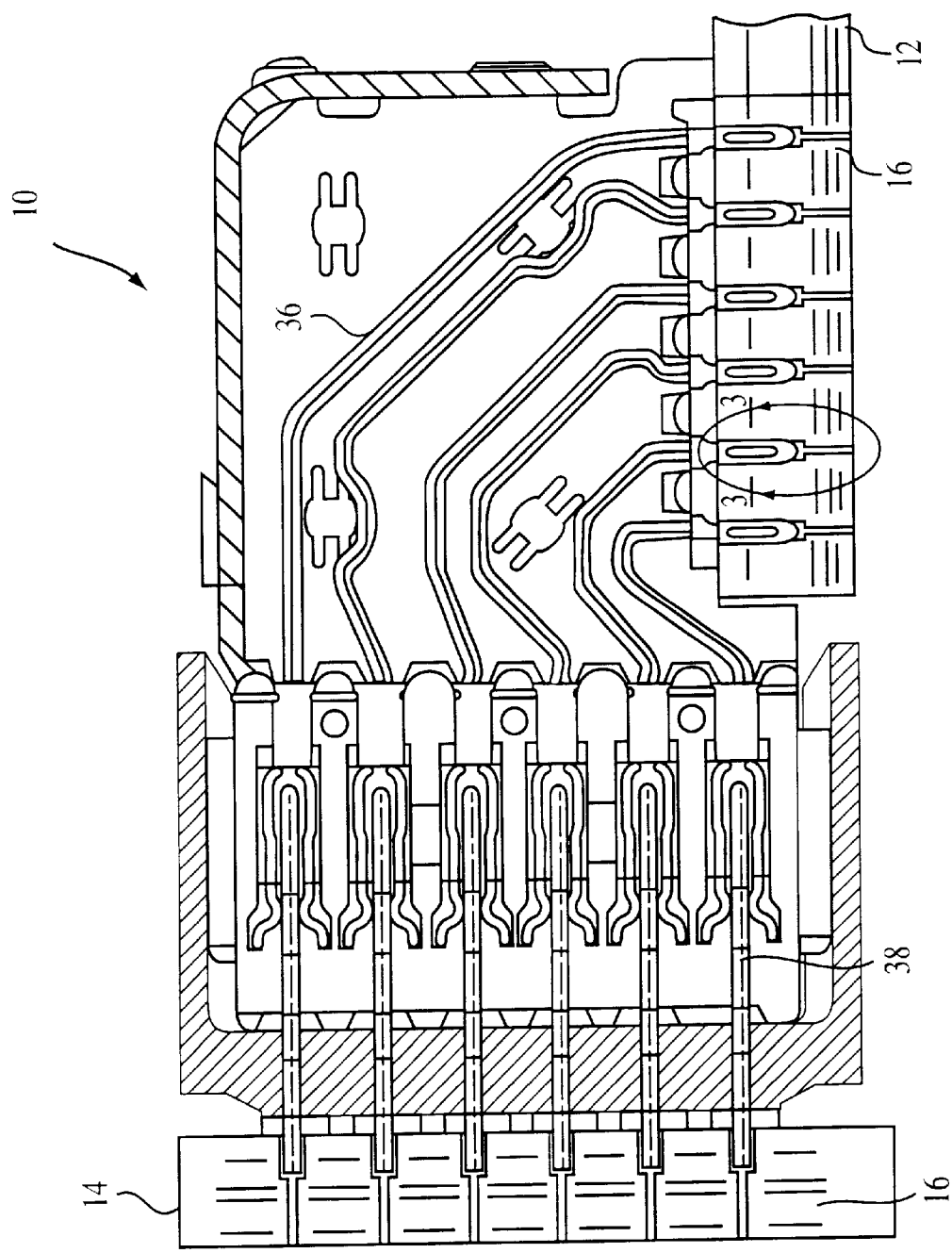
FIG. 2 is an assembled, cross-sectional sketch of a printed circuit board assembly of FIG. 1, according to the invention.

Referring now to FIGS. 1 and 2, a printed circuit board assembly 10 is shown. The assembly includes a pair of multi-level printed circuit boards 12, 14; one typically being a backplane printed circuit board 12 and the other a daughtercard printed circuit board 14. Each one of the boards 12, 14 includes a dielectric 16 having in the interior region 17 thereof, a plurality of electrical conductors 18 disposed in various levels of the board, an exemplary one of such levels of signal conductors 18 being shown in detail in FIGS. 3 and 4. Disposed between levels of the electrical conductors 18 are reference potential layers, or sheets 20 of electrically conductive material. These reference potential layers 20 are used to provide ground potential or reference voltages to electrical components, not shown, mounted on the surface of the printed circuit board 12, 14. Conductive vias 22, an exemplary one thereof being shown, pass from the surface 24 of the dielectric 16 into the interior region 17 of the dielectric 16. The electrical conductor 18 is connected to the conductive via 22, as shown.

As noted above, a plurality of reference potential layers 20 is disposed in the dielectric 16 between, and parallel to, the electrical conductors 18. These reference potential layers 20 also provide electric shielding between the signal conductor 18 disposed between a pair of the reference potential layers 20. It is noted that a reference potential layer 20, the underlying signal conductor 18 and the portion of the dielectric 16 therebetween provide a microstrip transmission line 25 having a predetermined impedance, such as 50 ohms. It is also noted that the signal conductor 18 is connected to the conductive via 22. Here, the conductive via 22 is configured to provide a termination impedance to the microstrip transmission line 25 substantially matched to the impedance of the microstrip transmission line 25. More particularly, the shape of the conductive via 22 and the separation between conductive via 22 and the edges 48 of the reference potential layers 20 are selected to terminate the microstrip transmission line 25 formed by such conductive sheet 20, the conductor 18, and the portion of the dielectric 16 therebetween into a matched load, i.e., into a termination impedance matched to the impedance of such microstrip transmission line 25 thereby maximizing the efficiency of the transfer of the data on the signal conductor 18 to the conductive via 22.

EXAMPLE

Figure 4:
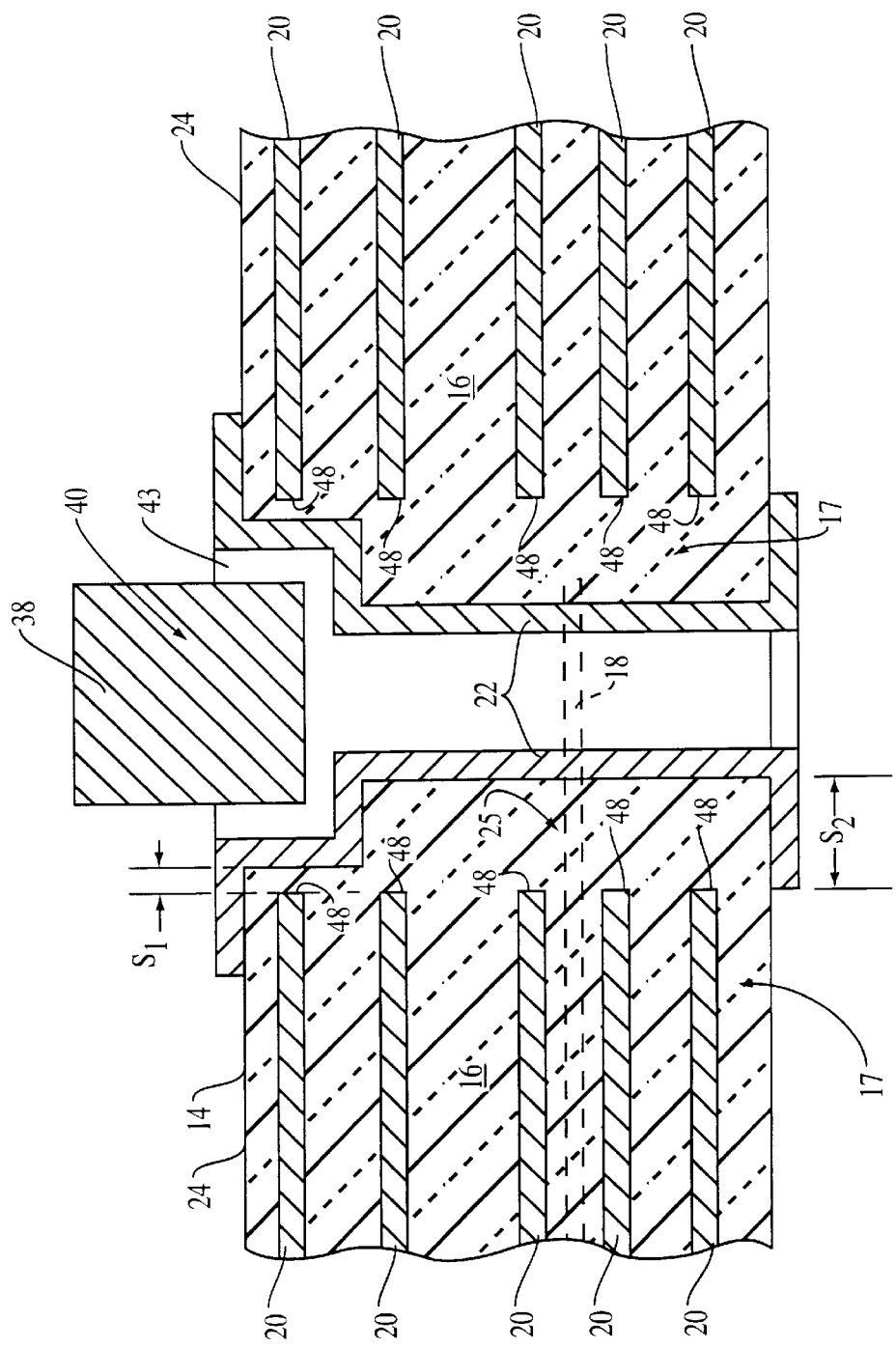
FIG. 4 is an enlarged view of another portion of the assembly of FIG. 2, such portion being enclosed in circle 4—4 of FIG. 2.

A test board was constructed using the configuration of FIG. 4. The board had a thickness of 0.222 inches. The wider portion 29 of via 22 had a diameter of 0.026 inches, with an inside diameter, after application of a conductive layer on the surfaces of the hole, of 0.022 inches. The hole was formed to a depth of 0.025 inches. The narrower portion 31 of via 22 had a diameter of 0.014. The distance S1 and S2 were set at 0.013 inches and 0.0215, respectively. The impedance of the via was measured for signals having a rise time of 100 psec. The impedance was measured to be 45.3 ohms, which was within 10% of the target value of 50 ohms. By way of comparison, a separate via was manufactured on the board with a constant diameter and with the setback to the ground plane being uniform at 0.013 inches. This via had a measured impedance of 35 ohms.

The assembly 10 (FIGS. 1 and 2) includes an electrical connector assembly 30 having a pair of electrical connectors 32, 34. The electrical connector 34 has a plurality of signal contacts 38 connected to the conductive vias 22 of one of the boards, here the backplane printed circuit board 12. An electrical connector 32 has signal contacts 36 connected to the conductive via 22 of the other one of the boards, here the daughtercard printed circuit board 14. The signal contacts 36 of the electrical connector 32 are adapted for electrical connection to the contacts 38 of the electrical connector 34, in a conventional manner, as shown, to electrically interconnect the printed circuit boards 12, 14.

Figure 3:
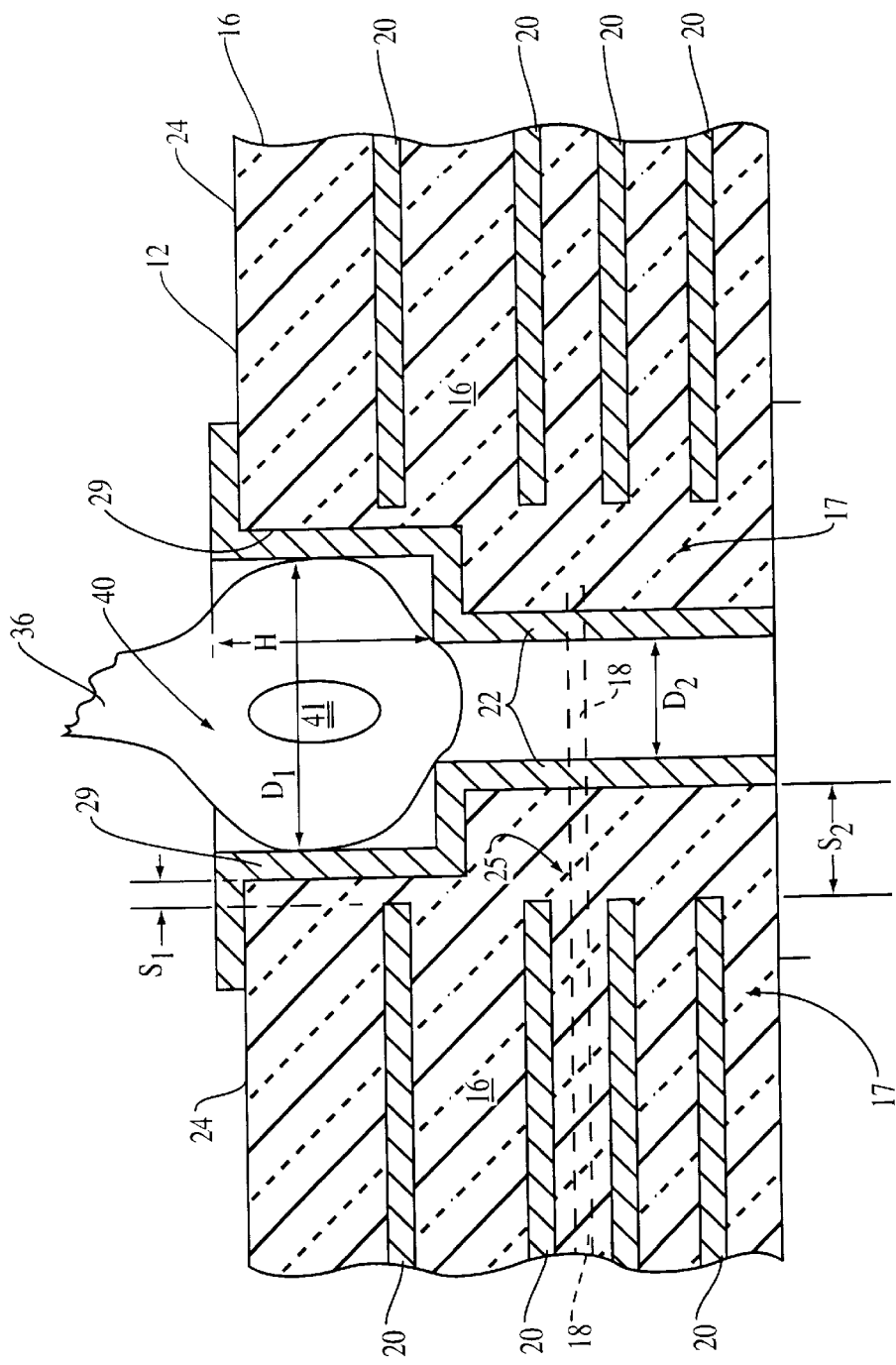
FIG. 3 is an enlarged view of a portion of the assembly of FIG. 2, such portion being enclosed in circle 3—3 of FIG. 2.

More particularly, and referring in more detail to FIGS. 3 and 4 to the printed circuit boards 12, 14, respectively, and considering an exemplary one of the conductive vias 22 in each one of such boards 12, 14, respectively, such conductive via 22 passes from the surface 24 of the dielectric 16 into an interior region 17 of the dielectric 16. The conductive via 22 is hollow having an upper surface portion 29 wider than the lower interior portion 31. The upper portion 29 has a width selected to receive a terminal pin 40 of the connector 32. Here, two types of such terminal pins 40 are shown. The terminal pin 40 for the via 22 in the backplane printed circuit board 12 (FIG. 3) is a resilient terminal pin having a hollow region 41 formed therein to enable such terminal pin 40 to compress somewhat as it forced into the wider surface portion 29 of the via 22. The terminal pin 40 for the via 22 in the backplane printed circuit board 12 (FIG. 4) is a pin 40 which is inserted into the wider surface portion 29 of the via 22 and then the wider surface portion 29 of the via 22 is filed with solder 43. The connection between the signal conductor 18 and the terminal pin 40 of each connector 32, 34 is called a signal launch.

As noted above, a plurality of reference potential layers 20 is disposed in the interior region 17 of the dielectric 16 parallel to the surface 24. The layers 20 have edges 48 terminating adjacent to the conductive via 22. The distance $S_1$ between the edges 48 and the sides of the conductive via 22 are typically selected by the printed circuit board manufacture to be some minimum distance to provide a degree of tolerance which will prevent an inadvertent short circuit between the conductive via 22 and the reference potential layer 20. Thus, typically, the same minimum distance $S_1$ is used along the entire interior 17 depth of the dielectric 16. For example, here the distance $S_1$ is 0.013" inches. Here, however, the distance $S_2$ between the edges 48 of the reference potential layers 30 and the sides of the conductive via 22 are selected, as noted above, to terminate the microstrip transmission line 25 formed by such conductive sheet 20, the conductor 18 and the portion of the dielectric 16 therebetween into a matched load, i.e., into a termination impedance matched to the impedance of such microstrip transmission line 25 thereby maximizing the efficiency of the transfer of the data on the signal conductor 18 to the conductive via 22. More particularly, it is noted that the plurality of reference potential layers 20 have edges 48 that terminate at different predetermined distances $S_1$, $S_2$ from the conductive via 22. More particularly, the edges 48 of the reference potential layers 20 adjacent the lower interior region 31 of the dielectric 16 are separated from the conductive via 22 a distance $S_2$ that is greater than the minimum clearance distance $S_1$ of the reference potential layers 20 adjacent the wider surface portion 29 of the conductive via 22. The distance $S_2$ is selected to reduce the capacitance between the edges 48 of the reference potential layers 20 and the conductive via 22. However, $S_2$ cannot be made arbitrarily large because of the loss of shielding between a pair of signal conductors 18 disposed on either side of such reference potential layer 20.

It is also noted that the vias 22 in both the backplane printed circuit board 12 and the daughtercard printed circuit board 14 are selected so that the microstrip transmission lines 25 in each of such boards 12, 14 are terminated in impedance matched to such microstrip transmission lines 25. Thus, with an electrical connector assembly constructed as a transmission line having an impedance matched to the impedance of the microstrip transmission lines 25 in each of the printed circuit boards 12, 14, data on the signal conductors 18 transfer between the printed circuit boards 12, 14 though the connector assembly 30 with maximum efficiency if the connector is designed with an impedance that closely matches the impedance of the signal traces in the printed circuit boards. Thus, the impedance from one of the boards through the electrical connector to the other one of the boards is substantially constant.

Thus, the wider, surface portion 29 of the hollow conductive via is selected to accommodate the terminal pin 40 while the narrower, interior portion 31 of the conductive via is selected for impedance matching termination of the microstrip transmission line 25.

A method for configuring the conductive vias 22 includes determining an impedance of the transmission lines 25 in the printed circuit boards 12, 14, for example with a conventional time domain reflectometer. As noted above, the transmission line 25 has a signal conductor 18 separated by a reference potential layer 20 by a portion of a dielectric 16. Then, the configuration of the conductive via 22 (i.e., the width of the width surface portion 29, the depth of the width surface portion 29 and the width of the narrower interior portion 31 are selected) along with the distance $S_2$ between the edges 48 of the reference potential layer 20 and the conductive via to provide the transmission line with a termination impedance substantially matched to the impedance of the transmission line 25 considering any loss in shielding with such distance $S_2$. A similar procedure is done for the other printed circuit boards.

Here, for example, the impedance provided by the vias is within 10% of the impedance of the printed circuit board having such via. The impedance through the connector is within 10% of the impedance of the via to which such connected is connected.

It will be appreciated that the numbers given herein are for illustration. The exact dimensions used for the setbacks between the ground planes and the vias will depend on several factors. The thickness of the board will influence the dimensions for S1 and S2. For thicker boards, greater setbacks will be required.

The invention will be particularly useful for thick boards. Boards with a thickness of less than 0.125 inches might provide impedances within 10% of the desired without having a reduced thickness section and without deviating from the standard setback from the ground planes. For boards greater than 0.200 inches thick, the invention will be particularly beneficial.

Also, the dimensions for S1 and S2 will depend on the frequency at which the board will be operated. Frequency is often expressed as the rise time of the fastest signals to be carried by the board. Boards operated at rise times slower than 300 psec might not require differential setbacks to achieve via impedances within 10%. However, the invention will be particularly useful for boards operated at rise times below 300 psec and particularly useful as rise times fall below 200 psec.

From the foregoing, it should be appreciated that the dimensions S1 and S2 will vary based on the thickness of the board and the operating speed. It is expected that a person designing a printed circuit board will select the dimensions for S1 and S2 based on several factors according to the following method: The diameter D2 typically will be dictated by the smallest hole the printed circuit board manufacturer can reliably make in a board. The dimension S1 will also typically be a standard parameter in the board manufacturing process.

The diameter D1 and the height H will be selected by the printed circuit board designer based on the type of connector to be inserted into the hole.

With these parameters established, an impedance computation can be performed at various values of S2 to determine the impedance of the overall signal launch. Impedance computations of this type are typically performed using commercial software package developed for impedance computations. The value of S2 yielding the desired impedance is then selected for manufacturing the board.

Figure 5:
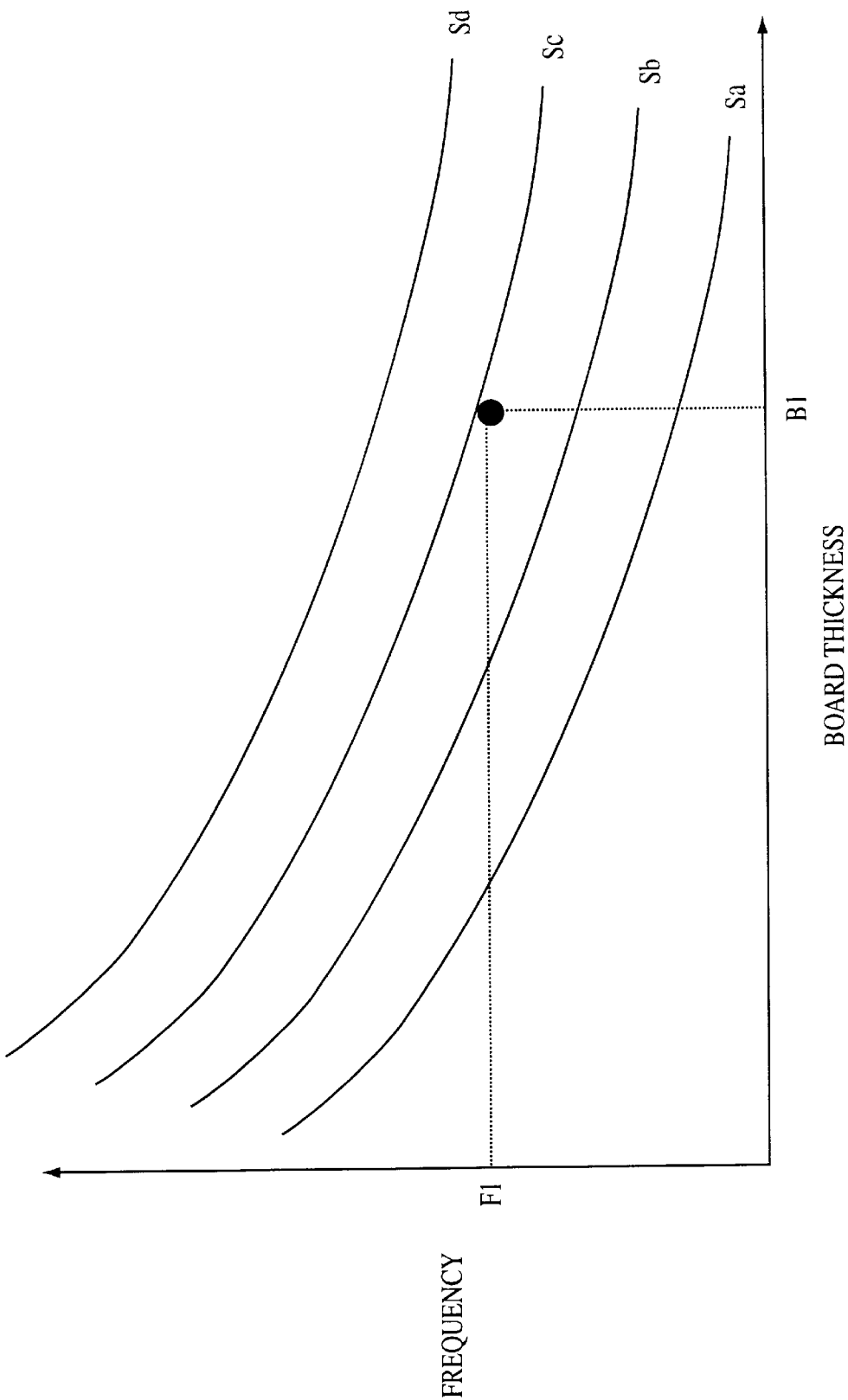
FIG. 5 is a graph used in understanding a method of designing a printed circuit board according to the invention.

FIG. 5 illustrates one way that the method of manufacturing the printed circuit board could be facilitated. FIG. 5 represents a graph that a printed circuit board manufacturer might prepare for a surface hole having a specific depth and diameter. Every value of S2 will yield a signal launch with the desired impedance for certain combinations of board thickness and operating frequency. FIG. 5 illustrates that these values can be plotted for various values of S2, which are illustrated as Sa, Sb, Sc and Sd.

To use this graph, a person designing a printed circuit board would identify the board thickness and operating frequency. From this information the person would then find the closest value of S2. FIG. 5 illustrates a point representing a board thickness of B1 and a frequency of F1. This point is closest to the curve with a value of Sc. Thus, Sc would be selected as the dimension for S2. It should be appreciated that Sc would have an actual numeric value associated with it that is derived from an impedance computation.

The process of selecting S2 would be repeated for each hole size on each board. To use the graphical method of selecting values of S2, a different graph would be required for each hole size.

Other embodiments are within the spirit and scope of the appended claims.

For example, it is described that impedance control is achieved solely by varying the dimension S2. Impedance control could also be achieved by varying the dimension S1. However, increasing S1 will be less desirable because the amount of area on the circuit board useful for routing signal traces will be reduced. As a rule of thumb, signal traces should be routed no closer to the edge of an adjacent ground plane than twice the vertical spacing between the signal trace and the ground plane. However, where, in order to obtain a signal launch with the desired impedance, it would be necessary to make S2 so large that the ground planes adjacent via 22 were further from the center of the via 22 than the ground planes adjacent surface hole 29, it might be preferable to increase the dimension S1. In this circumstance, it might be preferable to set S1 and S2 to a level that places the ground planes adjacent via 22 and hole 29 at the same distance from the center of via 22.

Also, a graphical technique is described by which a printed circuit board manufacturer could provided a designer with the information needed to design a printed circuit board. It will be appreciated that the same information and assistance could be provided as a computer program. The computer program would accept as input the board thickness and operating frequency. Board thickness might be specified as inches, millimeters, the number of layers in the board or in any other convenient units. The computer program would also require as an input an indication of the dimensions of the upper surface hole. This data might be specified in units of length or could be specified in terms of the type of device to be attached to the hole.

Such a computer program could then compute the required dimension for S2 and, if desired, S1. The computer program could operate by essentially performing the operations illustrated in conjunction with FIG. 5. Alternatively, the computer program could be programmed to solve the required dimensions using mathematical techniques.

What is claimed is:

1. A printed circuit board, comprising:
 (a) a dielectric having a surface;
 (b) a conductive via passing from the surface into an interior region of the dielectric, such conductive via having a wider region at a surface region of the dielectric than at an interior region of the dielectric;
 (c) a plurality of different levels of reference potential layers disposed in the interior region of the dielectric and parallel to the surface; and
 (d) a signal conductor disposed in the dielectric between, and parallel to, the reference potential layers to provide a transmission line having a predetermined impedance, such signal conductor being connected to the conductive via;
 wherein an edge of each of the reference potential layers is spaced from the conductive via a distance selected to provide an impedance to the transmission line substantially matched to the impedance of the transmission line.

2. The printed circuit board recited in claim 1 wherein the conductive via has a hollow in the wider region thereof.

3. The printed circuit board recited in claim 1 wherein the impedance to the transmission line is matched to within 10% of the impedance of the transmission line.

4. A printed circuit board, comprising:
 (a) a dielectric having a surface;
 (b) a conductive via passing from the surface into an interior region of the dielectric, such conductive via having a wider region at a surface region of the dielectric than at an interior region of the dielectric;
 (c) a plurality of different levels of reference potential layers disposed in the interior region of the dielectric and parallel to the surface, such plurality of layers having edges terminating at different predetermined distances from the conductive via; and
 (d) a signal conductor disposed in the dielectric between, and parallel to, the reference potential layers, such signal conductor being connected to the conductive via.

5. The printed circuit board recited in claim 4 wherein the first conductive via has a hollow in the wider region thereof.

6. A printed circuit board assembly comprising:
 a) a backplane having a plurality of vias therein, the vias having a lower portion with a first diameter and an upper portion having a second diameter larger than the first diameter, the backplane having reference planes therein with the spacing between a first reference plane and the lower portion of the vias being greater than the spacing between a second reference plane and the upper portion of the vias;
 b) a first electrical connector attached to the backplane, the electrical connector having a plurality of conducting members disposed within the upper portions of the plurality of vias;
 c) a daughter card having a plurality of vias therein, the vias having a lower portion with a third diameter and an upper portion having a fourth diameter larger than the third diameter, the backplane having reference planes therein with the spacing between a third reference plane and the lower portion of the vias being greater than the spacing between a fourth reference plane and the upper portion of the vias; and
 d) a second electrical connector attached to the daughter card and positioned to mate with the first electrical connector, the electrical connector having a plurality of conducting members disposed within the upper portions of the plurality of vias;
 wherein the spacing between the vias in the backplane and the first reference plane is greater than the spacing between the vias in the daughter card and the third reference plane.

7. The assembly of claim 6 wherein the backplane has a thickness in excess of 0.2 inches.

8. The assembly of claim 7 wherein the daughter card has a thickness greater than 0.125 inches.

9. The assembly of claim 6 wherein the spacing between the upper portion of the vias on the backplane and the second reference plane equals the spacing between the upper portion of the vias on the daughtercard and the fourth reference plane.

10. The assembly of claim 6 wherein the backplane has a thickness greater than 0.200 inches.

11. The assembly of claim 6 wherein each of the backplane and the daughter card has a thickness greater than 0.200 inches.

12. A printed circuit board assembly, comprising:
   (a) a first printed circuit board, comprising:
      (i) a first dielectric having a surface;
      (ii) a first conductive via passing from the surface into an interior region of the first dielectric;
      (iii) a first reference potential layer disposed in the interior region of the first dielectric parallel to the surface, such layer having an edge terminating adjacent to the conductive via; and
      (iv) a first signal conductor disposed in the first dielectric parallel to the first reference potential layer to provide a first transmission line having a first predetermined impedance, such first signal conductor being connected to the first conductive via;
   wherein a distance between the first conductive via and the edge of the first reference potential layer is selected to provide a first impedance to the first transmission line substantially matched to the first impedance of the first transmission line;
   (b) a second printed circuit board, comprising:
      (i) a second dielectric having a surface;
      (ii) a second conductive via passing from the surface into an interior region of the second dielectric;
      (iii) a second reference potential layer disposed in the interior region of the second dielectric parallel to the surface thereof, such second layer having an edge terminating adjacent to the second conductive via; and
      (iv) a second signal conductor disposed in the second dielectric parallel to the second reference potential layer to provide a second transmission line having a second predetermined impedance, such second signal conductor being connected to the second conductive via;
   wherein a distance between the second conductive via and the edge of the second reference potential layer is selected to provide a second impedance to the second transmission line substantially matched to the second impedance of the second transmission line; and
   (c) a first electrical connector having a first signal contact connected to the first conductive via; and
   (d) a second electrical connector having a second signal contact connected to the second conductive via;
   wherein the first signal contact of the first electrical connector is adapted for electrical connection to the second contact of the second electrical connector.

13. The printed circuit board assembly of claim 12, wherein the first impedance is the same as the second impedance.

14. The printed circuit board recited in claim 12 wherein the first and second printed circuit boards have different thicknesses and layer construction.

15. A printed circuit board assembly, comprising:
   a pair of printed circuit boards, each one of the boards comprising:
      a conductive via passing from a surface of a dielectric into an interior region of the dielectric;
      a reference potential layer; and
      a signal conductor disposed in the dielectric parallel to the reference potential layer to provide a transmission line having a predetermined impedance, the signal conductor being connected to the conductive via;
   wherein the reference potential layer has an edge separated from the conductive via a distance selected to provide an impedance to the transmission line substantially matched to the impedance of the transmission line;
   a first electrical connector having a signal contact connected to the conductive via of one of the boards; and
   a second electrical connector having a signal contact connected to the conductive via of the other one of the boards;
   wherein the first signal contact of the first electrical connector is adapted for electrical connection to the second contact of the second electrical connector.

16. A printed circuit board assembly, comprising:
   a pair of printed circuit boards, each one of the boards comprising:
      a conductive via passing from a surface of a dielectric into an interior region of the dielectric, such via being wider at a surface region of the dielectric than at the interior region of the dielectric;
      a plurality of reference potential layers; and
      a signal conductor disposed in the dielectric between, and parallel to, a pair of adjacent ones of the reference potential layers, the signal conductor being connected to the conductive via;
   wherein edges of the reference potential layers are different distances from the conductive via;
   a first electrical connector having a signal contact connected to the conductive via of one of the boards; and
   a second electrical connector having a signal contact connected to the conductive via of the other one of the boards;
   wherein the first signal contact of the first electrical connector is adapted for electrical connection to the second contact of the second electrical connector.

17. A printed circuit board assembly, comprising:
   (a) a first printed circuit board, comprising:
      (i) a first dielectric having a first surface;
      (ii) a first conductive via passing from the first surface into an interior region of the first dielectric, such first conductive via having a wider region at a surface region of the first dielectric than at an interior region of the first dielectric;
      (iii) a first plurality of different levels of reference potential layers disposed in the interior region of the first dielectric and parallel to the first surface; and
      (iv) a first signal conductor disposed in the first dielectric parallel to the first plurality of reference potential layers to provide a first transmission line having a first predetermined impedance, such first signal conductor being connected to the first conductive via;
   wherein the first conductive via is configured to provide an impedance to the first transmission line to within 10% of the first impedance of the first transmission line;

(b) a second printed circuit board, comprising:
  (i) a second dielectric having a second surface;
  (ii) a second conductive via passing from the second surface into an interior region of the second dielectric, such second conductive via having a wider region at a surface region of the second dielectric than at an interior region of the second dielectric;
  (iii) a second plurality of different levels of reference potential layers disposed in the interior region of the second dielectric and parallel to the second surface; and
  (iv) a second signal conductor disposed in the second dielectric parallel to the plurality of second reference potential layers to provide a second transmission line having a second predetermined impedance, such second signal conductor being connected to the second conductive via;

wherein the second conductive via is configured to provide an impedance to the second transmission line to within 10% of the first impedance of the second transmission line;

(c) a first electrical connector having a first signal contact connected to the first conductive via; and (d) a second electrical connector having a second signal contact connected to the second conductive via;

wherein the first signal contact of the first electrical connector is adapted for electrical connection to the second contact of the second electrical connector.

18. A printed circuit board assembly, comprising:
(a) a first printed circuit board, comprising:
  (i) a first dielectric having a surface;
  (ii) a first conductive via passing from the surface into an interior region of the first dielectric;
  (iii) a first reference potential layer disposed in the interior region of the first dielectric parallel to the surface, such layer having an edge terminating adjacent to the conductive via; and
  (iv) a first signal conductor disposed in the first dielectric parallel to the first reference potential layer to provide a first transmission line having a first predetermined impedance, such first signal conductor being connected to the first conductive via;

wherein a distance between the first conductive via and the edge of the first reference potential layer is selected to provide a first impedance to the first transmission line to within 10% of the first impedance of the first transmission line;

(b) a second printed circuit board, comprising:
  (i) a second dielectric having a surface;
  (ii) a second conductive via passing from the surface into an interior region of the second dielectric;
  (iii) a second reference potential layer disposed in the interior region of the second dielectric parallel to the surface thereof, such second layer having an edge terminating adjacent to the second conductive via; and
  (iv) a second signal conductor disposed in the second dielectric parallel to the second reference potential layer to provide a second transmission line having a second predetermined impedance, such second signal conductor being connected to the second conductive via;

wherein a distance between the second conductive via and the edge of the second reference potential layer is selected to provide a second impedance to the second transmission line to within 10% of the second impedance of the second transmission line; and (c) a first electrical connector having a first signal contact connected to the first conductive via; and (d) a second electrical connector having a second signal contact connected to the second conductive via;

wherein the first signal contact of the first electrical connector is adapted for electrical connection to the second contact of the second electrical connector.

\* \* \* \* \*